United States Patent [19]

De Bortoli et al.

[11] Patent Number: 4,563,637
[45] Date of Patent: Jan. 7, 1986

[54] SYSTEM FOR MEASURING AMPLITUDE OF NOISE-CONTAMINATED PERIODIC SIGNAL

[75] Inventors: Marco De Bortoli, Turin; Adler Tofanelli, Collegno; Luigi Varetto, San Mauro Torinese, all of Italy

[73] Assignee: Cselt Centro Studi e Laboratori Telecomunicazioni S.p.A., Turin, Italy

[21] Appl. No.: 515,352

[22] Filed: Jul. 19, 1983

[30] Foreign Application Priority Data

Jul. 19, 1982 [IT] Italy .................. 67919 A/82

[51] Int. Cl.$^4$ ............................. G01R 23/16
[52] U.S. Cl. ................... 324/77 A; 307/351; 324/103 P; 328/151; 375/118
[58] Field of Search ............ 324/77 A, 103 R, 103 P; 328/150, 151, 155; 356/73.1; 307/351, 354; 375/95, 118, 119

[56] References Cited

U.S. PATENT DOCUMENTS

| | | | |
|---|---|---|---|
| 3,299,357 | 1/1967 | Darlington | 328/151 |
| 3,440,548 | 4/1969 | Saltzberg | 328/151 |
| 3,465,247 | 9/1969 | Kubo | 324/77 A |
| 3,541,320 | 11/1970 | Beall | 328/151 |
| 3,681,601 | 8/1972 | Paap et al. | 324/103 P |
| 3,701,953 | 10/1972 | Lubarsky, Jr. | 328/150 |
| 3,727,130 | 4/1973 | Estienne | 324/77 A |
| 3,790,767 | 2/1974 | Alexander | 324/77 A |
| 3,908,084 | 9/1975 | Wiley | 375/119 |
| 4,069,452 | 1/1978 | Conway et al. | 324/103 P |
| 4,306,194 | 12/1981 | Chapman | 328/150 |

*Primary Examiner*—Ernest F. Karlsen
*Assistant Examiner*—Kevin D. O'Shea
*Attorney, Agent, or Firm*—Karl F. Ross; Herbert Dubno

[57] ABSTRACT

In order to measure the amplitude of a periodic signal of known frequency which may be heavily contaminated by noise and whose phase is not known at the point of measurement, e.g. at an output end of an optical fiber, two samples are periodically taken in every cycle at instants spaced apart by a quarter-cycle. The two samples are accumulated over N cycles and the signs of the resulting algebraic sums are compared at every $N^{th}$ cycle to determine whether the sampling phases should be advanced or retarded within a cycle by a predetermined increment $\Delta$ in order to let the first and the second sample of a pair respectively approach the peak and the zero crossing of a half-cycle of the signal wave at which point, with the noise more or less balanced out, the second sum is substantially zero while the first sum represents N times the actual signal amplitude.

13 Claims, 5 Drawing Figures

SYSTEM FOR MEASURING AMPLITUDE OF NOISE-CONTAMINATED PERIODIC SIGNAL

FIELD OF THE INVENTION

Our present invention relates to a method of and a system for measuring the amplitude of a periodic signal, e.g. a sine wave, which arrives from a remote source at the point of measurement where its frequency—but not its phase—is generally known and where the presence of a substantial noise level impedes the detection of amplitude peaks and zero crossings by conventional means.

BACKGROUND OF THE INVENTION

Such conditions may exist, for example, at the otput end of a fiber-optical signal path whose attenuation is to be determined by amplitude measurements. This is usually done by illuminating the input end of the optical fiber with a beam of light modulated by a sinusoidal signal of predetermined amplitude. The transmitted radiation is picked up at the opposite end by a photodetector working into a high-gain amplifier which suppresses the d-c component of the received signal and has a limited bandwidth (usually less than 1 KHz) centered on the nominal frequency of the sinusoidal modulation. Further narrow-band filtering serves to suppress the accompanying noise.

Analog filtering with tuned circuits of high figure of merit or Q-factor (about $10^3$) causes problems when the nominal frequency changes because of unpredictable influences such as temperature variations or component aging. The use of a crystal-controlled oscillator at the transmitting end is generally inconvenient, on account of the low modulating frequencies normally utilized, and mechanical frequency generators are cumbersome. The transmission of a phase reference to the measurement site would require a separate signal path.

Signals of high frequency stability can also be generated by a digital processor with recursive or transversal filtering. The frequency, in that case, depends solely on the recurrence rate of a train of clock pulses that can be derived from a crystal-stabilized oscillator through suitable step-down stages. Because of its complexity, however, such a circuit arrangement would not be very practical for the generation of the modulating signals at the transmitting end.

OBJECTS OF THE INVENTION

The general object of our present invention, therefore, is to provide a simplified method of and means for measuring the amplitude of an incoming periodic signal under circumstances such as those described above.

According to a more particular object of our invention, this method and means should be effective even when the frequency of the incoming signal is not precisely known or is subject to some variation.

SUMMARY OF THE INVENTION

In accordance with our present invention, a first sample is periodically extracted from an arriving signal at instants spaced apart by substantially a whole number of signal cycles, preferably a single cycle. A second sample is periodically extracted from the arriving signal at instants that are offset by a quarter cycle from the instants of extraction of the first sample. This offset could be either positivie or negative; it is positive in the embodiment particularly described hereinafter, i.e. the second sample trails the first sample by a phase angle of substantially $\pi/2$. Each of these samples is accumulated for N consecutive occurrences thereof, with N an integer greater than 1, to obtain a first and a second algebraic sum. A comparison of these sums shows whether or not the two samples extracted in each signal cycle lie within the same half-cycle, this comparison determining the sense in which the instants of extraction of the two samples are to be codirectionally shifted by a corrective phase increment to make their occurrences more nearly coincident with a peak and a zero crossing of the arriving signal, respectively. When the second algebraic sum substantially disappears, i.e. hovers around zero, the first sum is almost exactly equal to N times the amplitude of the periodic signal and can therefore be utilized for a determination of the absolute magnitude of that amplitude through a simple division by N.

Pursuant to a more particular feature of our invention, we prefer to subject the extracted samples—or at least the first one—to active digital filtering prior to accumulation. With a suitably high recurrence number N, any residual noise will more or less balance out in the accumulation stage so that the final value, i.e. the first sample averaged over N occurrences, will be essentially noise-free. Thus, even a very unfavorable signal-to-noise ratio (SNR) at the output end of the transmission path will yield useful results; we have found that an SNR between zero and $-10$ dB can be tolerated with our improved system.

The number N is advantageously a power of 2 so that, with digital processing, the division of the first algebraic sum can be carried out by a simple shifting of bits; of course, only the absolute magnitude of this algebraic sum will be of interest.

BRIEF DESCRIPTION OF THE DRAWING

The above and other features of our invention will now be described in detail with reference to the accompanying drawing in which.

SPECIFIC DESCRIPTION

Figure 1:
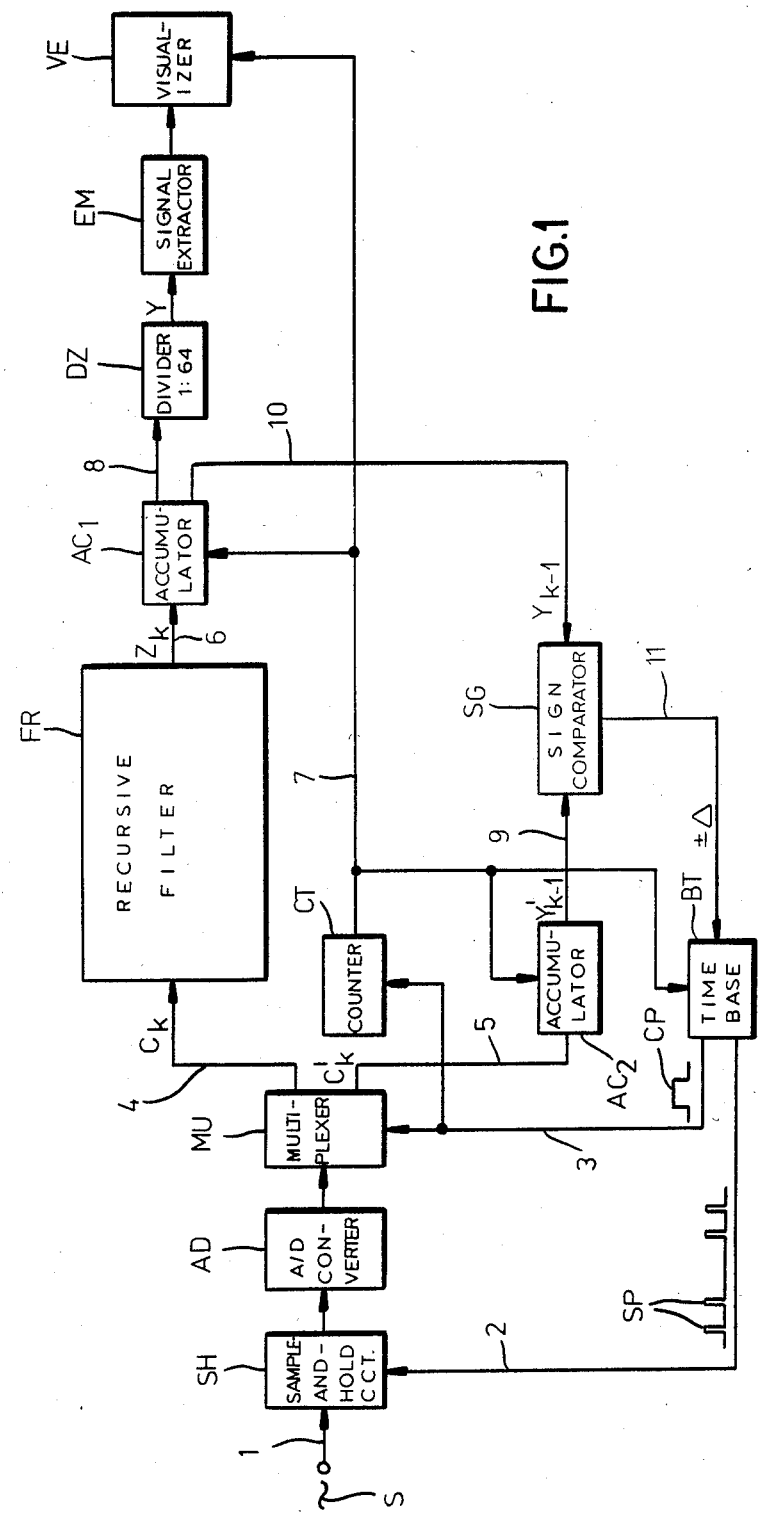
FIG. 1 is a block diagram of an amplitude-measuring system according to our invention.

As shown in FIG. 1, an incoming periodic signal S—which may be heavily contaminated by accompanying noise—arrives at an input 1 of a sample-and-hold circuit SH from a nonillustrated transmission path. The latter may be an optical fiber illuminating a photoelectric transducer also not shown. Circuit SH is controlled, via a lead 2, by a time base BT including a preferably crystal-stabilized generator of clock pulses CP whose cadence or repetition frequency equals the presumed frequency of the incoming signal. These clock pulses CP have a width equal to a quarter-cycle; their leading and trailing edges give rise to respective spikes SP which trigger the circuit SH into extracting from signal S two samples per cycle which are relatively offset by T/4, T being the recurrence period of the clock pulses. These samples are digitized in an analog/digital converter AD and arrive at a multiplexer MU which, also under the control of time base BT, directs the leading sample $C_k$ of each pair to a circuit branch 4 and the trailing sample $C'_k$ to a circuit branch 5. Branch 4 extends to a recursive filter FR, more fully described hereinafter with reference to FIG. 5, whose output 6 leads to an accumulator $AC_1$; branch 5 terminates at another accumulator $AC_2$. The two accumulators are controlled by a pulse counter CT which is stepped by time base BT and energizes an output lead 7 after a count of N clock pulses, N being $2^6 = 64$ in the present instance.

An output 8 of accumulator $AC_1$ extends to an arithmetic unit DZ which divides by N the digital sum periodically emitted by that accumulator in response to a reading command on lead 7 which also clears the accumulator immediately after such emission. The absolute magnitude of the quotient Y calculated by divider DZ is delivered by an extractor EM to a visualizer VE for display on an observation screen and/or for graphic recording; the reading command on lead 7 is also fed to visualizer VE for periodically updating the displayed magnitude by reloading a data store thereof coupled to the extractor.

Accumulator $AC_2$, too, has an input connected to lead 7 so as to emit the algebraic sum of the preceding N samples $C'_k$ on an output connection 9 and to be cleared immediately thereafter. Connection 9 and a similar connection 10, originating at accumulator $AC_1$, terminate at a sign comparator SG simultaneously receiving the two algebraic sums $Y_{k-1}$ and $Y'_{k-1}$ from the two accumulators. An output lead 11 of comparator SG carries a corrective signal $\pm \Delta$ whose polarity depends on whether the two digital sums $Y_{k-1}$ and $Y'_{k-1}$ are of the same sign or of different signs. The corrective signal $\pm \Delta$ is supplied to time base BT for advancing or retarding the phase of its clock pulses CP by an increment $\Delta$ when the time base is enabled for such a phase shift by a reading command on lead 7. This increment $\Delta$ has a fixed absolute value whose choice determines the measurement accuracy and which in any event should be a minor fraction of a quarter-cycle.

While neither of the algebraic sums read out from accumulators $AC_1$ and $AC_2$ is likely ever to have exactly the value zero, comparator SG may be designed to emit no corrective signal when the absolute magnitude $Y'_{k-1}$ lies below a certain threshold so as to avoid any unnecessary overcorrection. A zero value of sum $Y_{k-1}$ may be treated as being of either sign.

For an incoming signal of amplitude A and frequency $f_0$, samples $C_k$ and $C'_k$ are given, starting from an initial phase $\phi$, by $$C_k = A \cdot \sin\,[2\pi(f_0-f_s)t_k+\phi+\Delta_k]+X_k$$

and $$C'_k = A \cdot \sin\,[2\pi(f_0-f_s)t_k+\phi+\pi/2]+X'_k$$

where $X_k$ and $X'_k$ are the noise values present at the respective instants of extraction of these samples, $t_k$ is the time at which sample $C_k$ is taken, and $f_s$ is the sampling frequency, i.e. the cadence of the clock pulses of time base BT. In the ideal case of $f_0 = f_s$, of course, the first term within the brackets disappears. The corrective term $\alpha_k$ represents the sum of all preceding phase increments and thus can be given by $$\Delta_k = \Delta_{k-1} + \Delta \cdot \text{sign}\,(Y_{k-1} \cdot Y'_{k-1}) \cdot \text{Mod}\,(k+N)$$

where Mod $(k+N)$ is a parameter whose value is 1 when the cycle count k is a multiple of N—i.e. when counter CT energizes its output lead 7—and is zero at all other times.

The frequency difference $f_0 - f_s$, if any, is also a factor in determining the maximum lock-on time $t_{max}$ required for bringing the algebraic sum $Y'_{k-1}$ to a near-zero value so as to establish a correct reading of amplitude A. This time is given by $$t_{max} = (NT/4[\Delta \pm NT(f_0-f_s)];$$

with $f_0 = f_s$, of course, this time reduces to $NT/4\Delta$. The frequency difference $f_0 - f_s$ may have a shortening or lengthening effect upon this lock-on time, depending on its own sign and on the sense in which the phase must be adjusted according to the output signal of comparator SG.

Figure 2:
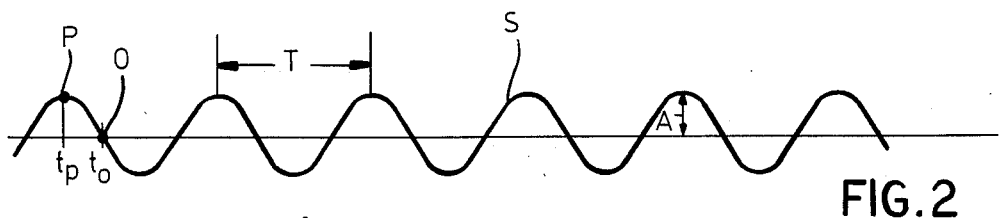
FIGS. 2, 3 and 4 are graphs used for explaining the mode of operation of the system of FIG. 1.

In FIG. 2 we have shown a sine wave S whose amplitude A is to be measured by the system of FIG. 1 and which is assumed to have a cycle length T corresponding to that of time base BT. In the ideal case, in which the time base is locked onto signal wave S, the two samples of a recurrent pair are taken at consecutive instants $t_p$ and $t_o$ respectively coinciding with points P' and O'. These two points lie on the same half-cycle of the wave so that the samples are of equal sign or polarity, calling for a forward shifting (after N occurrences) by an increment $+\Delta$ to respective positions $t_p''$ and $t_o''$ corresponding to points P'' and O''. The new points P'' and O'' still lie on the same half-cycle whereupon another forward shift by the same increment $+\Delta$ will bring about an exact coincidence with the peak P and the zero crossing O. Such an exact coincidence, of course, is again an idealized situation.

Figure 3:
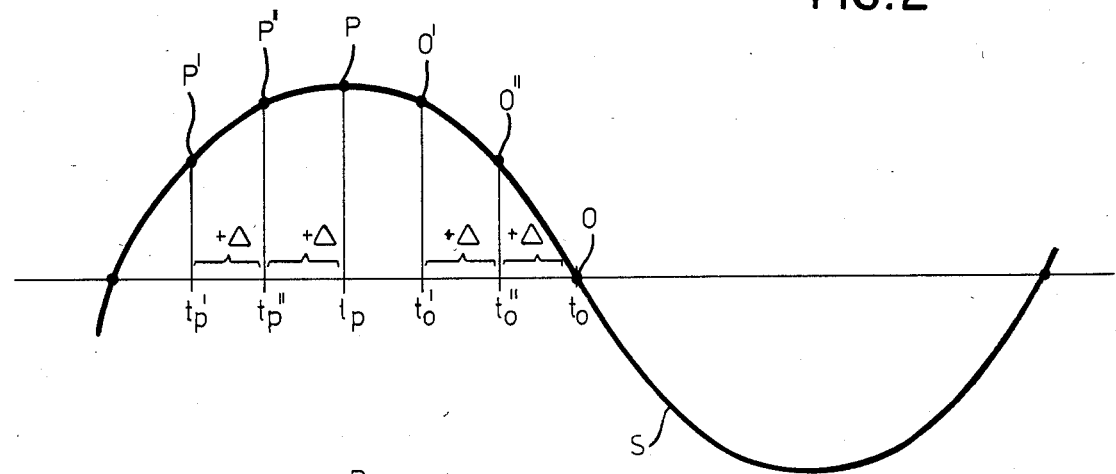
Figure 4:
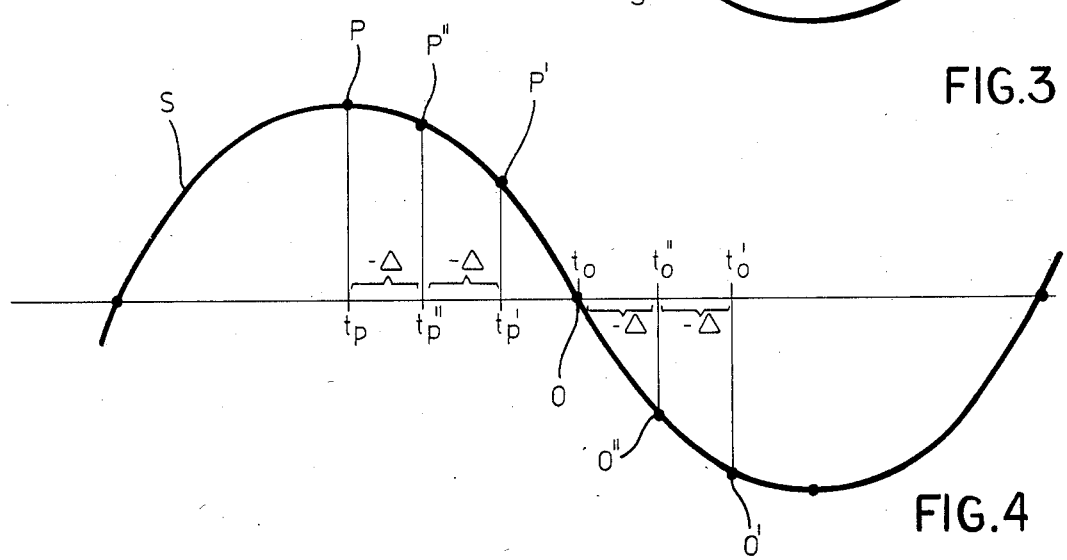

FIG. 4 shows initial sampling instants $t_p'$ and $t_o'$ corresponding to points P' and O' on different half-cycles of wave S, the two samples being therefore of opposite signs or polarities. Comparator SG (FIG. 1), accordingly, instructs time base BT to retard the phase by a negative increment $-\Delta$, resulting after N cycles in new time positions $t_p''$ and $t_o''$ corresponding to points P'' and O'' closer to peak P and zero crossing O, respectively. Another such shift, N cycles later, brings about the same precise coincidence as in FIG. 3.

In practice, overshooting of the desired time positions will result in hunting about points P and O unless the emission of corrective signals by comparator SG is suppressed for low values of sum $Y'_{k-1}$ as noted above. It will also be evident that a reduction in the magnitude of increment $\Delta$ will enable a closer approach to points P and O from any starting phase; with small values of $\Delta$, such hunting may not be objectionable so that the signal on lead II could be of binary character.

After lock-on has been achieved, a frequency difference $f_0 - f_s$ may again bring about a significant disalignment whereupon a new intervention of sign comparator SG will provide another correction. With small frequency differences such a correction may hold for a large number of cycles.

Figure 5:
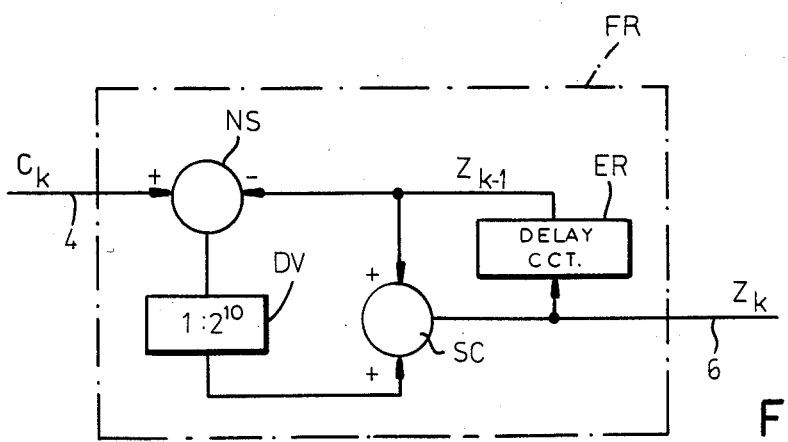
FIG. 5 is a more detailed view of an active filter shown in FIG. 1.

As shown in FIG. 5, the active filter FR comprises an algebraic summing circuit NS receiving the incoming raw sample $C_k$ on line 4 at an additive input and having a subtractive input to which a preceding filtered sample $Z_{k-1}$ is applied from a delay circuit ER connected to outgoing line 6. The resulting numerical difference is fed to a divider DV of step-down ratio $1:2^{10}$; this divider, like component DZ, may be a simple shift register. Another summing circuit SC has two additive inputs respectively receiving the quotient calculated by divider DV and the sample $Z_{k-1}$ emitted by delay circuit ER, thereby producing a filtered sample $Z_k$ on lead 6. The delay introduced by circuit ER equals one clock period T.

The filtered sample $Z_k$ is given by $$Z_k = C_k(1-\alpha) + \alpha \cdot Z_{k-1}$$

wherein $\alpha$ is a transfer coefficient determining the bandwidth of this first-order recursive filter. In the specific instance described, $\alpha = 1 - 2^{-10}$ which corresponds to a bandwidth of about $f_s/1000$. The noise-reducing effect of filter FR amounts to about 50 to 60 dB so that an initial SNR of $-10$ dB will provide a final SNR of 40 to 50 dB. A similar filter could be inserted in circuit branch 5, upstream of accumulator $AC_2$, though this has not been illustrated.

The value $Y \approx A$ is given by $$Y = \frac{1}{N} \sum_{i=1}^{N} Z_i$$

and is therefore the mean of the N filtered samples $Z_k$ delivered by device FR during an N-cycle counting period.

We claim:

1. A method of measuring the amplitude of a periodic signal of generally known frequency and unknown phase arriving from a remote source in the presence of a substantial noise level, comprising the steps of:
   (a) periodically extracting a first sample from the arriving signal at instants spaced substantially a whole number of signal cycles apart;
   (b) periodically extracting a second sample from the arriving signal at instants offset by a quarter-cycle from the instants of extraction of said first sample;
   (c) accumulating said first sample over N consecutive occurrences thereof to obtain a first algebraic sum, N being an integer greater than 1;
   (d) accumulating said second sample over N consecutive occurrences thereof to obtain a second algebraic sum;
   (e) comparing the signs of said algebraic sums to determine whether or not the instants of extraction of said first and second samples lie in the same half-cycle of the signal;
   (f) codirectionally shifting the instants of extraction within a signal cycle, by a corrective phase increment whose sign depends on the result of the comparison in step (e), to make the occurrences of said first and second samples more nearly coincident with a peak and a zero crossing of the arriving signal, respectively; and
   (g) upon substantial disappearance of said second sum, deriving from said first algebraic sum the absolute magnitude of the signal amplitude.

2. A method as defined in claim 1 wherein the shifting of the instants of extraction in step (f) is an advance in the event of equality and a retardation in the event of inequality of the signs compared in step (e).

3. A method as defined in claim 1 wherein at least said first sample is digitally filtered before being accumulated.

4. A method as defined in claim 3 wherein N is a power of 2.

5. A method as defined in claim 1 wherein said whole number is one.

6. A method as defined in claim 1 wherein step (g) involves a division of said first algebraic sum by N.

7. A system for measuring the amplitude of a periodic signal of generally known frequency and unknown phase arriving from a remote source in the presence of a substantial noise level, comprising:
   input means arranged to receive the arriving signal;
   sampling means connected to said input means;
   timing means controlling said sampling means for periodically extracting pairs of consecutive samples from respective cycles of the arriving signal, each pair consisting of a first and a second sample offset from each other by a quarter-cycle;
   first accumulating means connected to said sampling means and controlled by said timing means for integrating N consecutive occurrences of said first sample into a first algebraic sum, N being an integer greater than 1;
   second accumulating means connected to said sampling means and controlled by said timing means for integrating N consecutive occurrences of said second sample into a second algebraic sum;
   comparison means connected to said first and second accumulating means for modifying the operation of said timing means after every N occurrences of said pairs to shift the instants of extraction of said samples within a cycle, by a corrective phase increment, in one sense upon said algebraic sums being of the same sign and in the opposite sense upon said algebraic sums being of different signs to make the occurrences of said first and second samples more nearly coincident with a peak and a zero crossing of the arriving signal, respectively; and
   indicator means connected to said first accumulating means for deriving a measure of the amplitude of the arriving signal from said first algebraic sum upon substantial disappearance of said second algebraic sum.

8. A system as defined in claim 7, further comprising analog/digital conversion means, inserted between said sampling means and said first and second accumulating means, and multiplexer means downstream of said conversion means controlled by said timing means for respectively directing digitized first and second samples to said first and second accumulating means.

9. A system as defined in claim 8, further comprising digital filter means interposed between said multiplexer means and at least one of said accumulating means.

10. A system as defined in claim 9 wherein said digital filter means comprises a recursive filter upstream of said first accumulating means.

11. A system as defined in claim 8, further comprising arithmetic means inserted between said first accumulating means and said indicator means for dividing said first algebraic sum by N to produce the absolute magnitude of the signal amplitude to be measured.

12. A system as defined in claim 7 wherein said indicator means comprises a visualizer.

13. A system as defined in claim 12 wherein said timing means includes a counter of clock pulses unloading said first and second accumulating means and activating said visualizer after every N clock pulses.

* * * * *